(12) United States Patent
Zhang

(10) Patent No.: US 8,564,137 B2
(45) Date of Patent: Oct. 22, 2013

(54) SYSTEM FOR RELIEVING STRESS AND IMPROVING HEAT MANAGEMENT IN A 3D CHIP STACK HAVING AN ARRAY OF INTER-STACK CONNECTIONS

(75) Inventor: John Hongguang Zhang, Fishkill, NY (US)

(73) Assignee: STMicroelectronics, Inc., Coppell, TX (US)

(*) Notice: Subject to any disclaimer, the term of this patent is extended or adjusted under 35 U.S.C. 154(b) by 266 days.

(21) Appl. No.: 12/940,881

(22) Filed: Nov. 5, 2010

(65) Prior Publication Data

US 2012/0112357 A1 May 10, 2012

(51) Int. Cl.
*H01L 23/48* (2006.01)

(52) U.S. Cl.
USPC ............. 257/774; 257/E25.027; 257/E23.174

(58) Field of Classification Search
USPC .................. 257/686, 777, E25.006, E25.013, 257/E25.018, E25.021, E25.027, E23.085, 257/E21.614; 438/109, FOR. 368, FOR. 426
See application file for complete search history.

(56) References Cited

U.S. PATENT DOCUMENTS

| | | | | |
|---|---|---|---|---|
| 6,831,367 | B2* | 12/2004 | Sekine | 257/774 |
| 7,498,675 | B2* | 3/2009 | Farnworth et al. | 257/723 |
| 7,596,464 | B2 | 9/2009 | Hermerding et al. | |
| 2001/0002330 | A1* | 5/2001 | Benenati et al. | 438/613 |
| 2004/0227236 | A1* | 11/2004 | Sawamoto | 257/734 |
| 2005/0051883 | A1* | 3/2005 | Fukazawa | 257/686 |
| 2007/0222054 | A1* | 9/2007 | Hembree | 257/686 |
| 2008/0174002 | A1* | 7/2008 | Chen et al. | 257/690 |
| 2008/0237881 | A1* | 10/2008 | Dambrauskas et al. | 257/774 |
| 2009/0085183 | A1* | 4/2009 | Mitchell et al. | 257/686 |
| 2009/0085233 | A1 | 4/2009 | Krishnamoorthy et al. | |
| 2009/0127667 | A1* | 5/2009 | Iwata | 257/621 |
| 2010/0059897 | A1* | 3/2010 | Fay et al. | 257/777 |
| 2010/0140753 | A1* | 6/2010 | Hembree | 257/621 |
| 2012/0061834 | A1* | 3/2012 | Kang | 257/738 |

OTHER PUBLICATIONS

Screenshots of http://www.samsung.com/global/business/semiconductor/products/fusionmemory/Products_MCP_pkginfo.html taken Feb. 23, 2011, 3 pgs.
Yang, et al., Interconnect Technologies for Heterogeneous 3D Integration: CMOS and MEMS, pp. 289-298, Mater. Res. Soc. Symp. Proc. vol. 1249, 2010.

* cited by examiner

*Primary Examiner* — Bilkis Jahan
(74) *Attorney, Agent, or Firm* — Gardere Wynne Sewell LLP

(57) ABSTRACT

The present disclosure provides a system and method for relieving stress and providing improved heat management in a 3D chip stack of a multichip package. A stress relief apparatus is provided to allow the chip stack to adjust in response to pressure, thereby relieving stress applied to the chip stack. Additionally, improved heat management is provided such that the chip stack adjusts in response to thermal energy generated within the chip stack to remove heat from between chips of the stack, thereby allowing the chips to operate as desired without compromising the performance of the chip stack. The chip stack also includes an array of flexible conductors disposed between two chips, thereby providing an electrical connection between the two chips.

50 Claims, 13 Drawing Sheets

SYSTEM FOR RELIEVING STRESS AND IMPROVING HEAT MANAGEMENT IN A 3D CHIP STACK HAVING AN ARRAY OF INTER-STACK CONNECTIONS

BACKGROUND

1. Technical Field

The present invention relates generally to micro-electromechanical systems (MEMS) and, more specifically, to a system and method for relieving stress and optimizing heat management in a three dimensional (3D) chip stack.

2. Introduction

As consumer demand increases for smaller multi-function devices, manufacturers face significant challenges to integrate different semiconductor technologies on a single die. Multichip packages such as, for example, 3D chip stacks, have become increasingly popular to increase device density and to combine traditionally incompatible technologies, such as logic, analog, memory, and MEMS. One of the major challenges facing multichip packages is stress applied to its components. One element contributing to the stress of the components is packaging designs implementing a fixed-distance chip stack. The stress resulting from the fixed-distance chip stack may warp the components and may even cause physical damage to the chip stack. Many conventional multichip package designs have attempted to alleviate stress by implementing a mechanically flexible interconnection (MFI) such as, for example, using a through silicon via (TSV). However, known MFIs are required to maintain a constant vertical alignment between chips to maintain electrical connection and provide stress relief. However, due to this alignment restriction, known MFIs only relieve stress in a vertical direction and are susceptible to loss of connection as a result of cross-directional, horizontal movement between the chips.

Another adverse condition facing the components of a multichip package is heat generated through use of the multichip package. Heat generated in chip stacks is known to cause the multichip package to malfunction. As such, heat management may be implemented to alleviate the heat in the chip stack. However, known methods of heat management such as, for example, thermal throttling, respond to the detection of an overheating chip stack by reducing the power to the chip stack or reducing the speed at which the chip stack is running Accordingly, current methods of heat management limit the performance of the chip stack and are, therefore, undesirable.

SUMMARY

The present disclosure provides a system and method for relieving stress and providing improved heat management in a 3D chip stack of a multichip package.

In an embodiment of the present disclosure, stress is relieved in a 3D chip stack through the use of a stress relief apparatus. The stress relief apparatus responds to pressure applied to the chip stack by adjusting the positioning of the chips to thereby relieve stress applied to the chip stack.

In another embodiment of the present disclosure, improved heat management is provided in a 3D chip stack by implementing heat sink walls disposed along the outside surfaces of the chips of the 3D chip stack and an elastic thermal material disposed between the heat sink walls and the chips of the chip stack. The elastic thermal material receives heat generated within the chip stack, causing the elastic thermal material to expand locally. The expansion of the elastic thermal material adjusts the positioning of the chip stack, thereby allowing the heat to transfer from the elastic thermal material to the heat sink walls where it is absorbed and removed from the chip stack.

In another embodiment of the present disclosure, stress is relieved in a 3D chip stack through the use of a stress relief apparatus, and signals are transmitted between the chips through an array of inter-stack connections, also referred to herein as flexible conductors. The stress relief apparatus responds to pressure applied to the chip stack by adjusting the positioning of the chips to thereby relieve stress applied to the chip stack.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures exaggerated to show detail supporting the text of the disclosure, in which like reference numbers indicate similar parts, and in which.

DETAILED DESCRIPTION OF THE DRAWINGS

Figure 1:
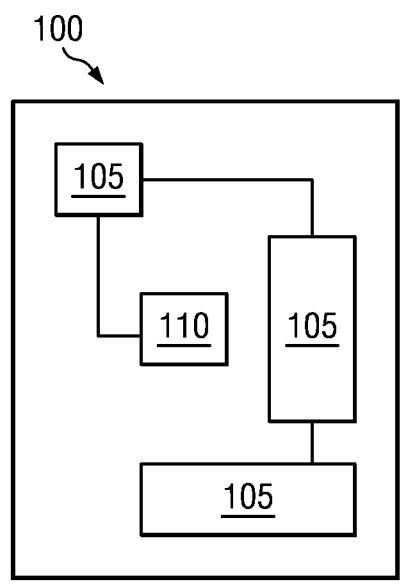
FIG. 1 illustrates an overhead view of an example chip.

The present disclosure provides a system and method for relieving stress and providing improved heat management in a 3D chip stack of a multichip package. The 3D chip stack is comprised of two or more chips, wherein a chip may comprise a substrate and other components known in the art such as, for example, metallization layers, circuitry, bonding pads, through silicon vias, etc. In embodiments of the present disclosure, stress relief and improved heat management are generally provided, at least in part, by a stress relief apparatus having adjusting functionality. One of the advantages of implementing the stress relief apparatus is that the circuitry located within the chip may be distributed as desired without affecting the stress relief apparatus or its adjusting functionality. Accordingly, stress relief may be provided for a chip stack while maintaining the preferred design and functionality of each chip. FIG. 1 illustrates an overhead view of an example chip 100, wherein the circuitry 105 is shown on the surface of the chip 100. In some embodiments, the circuitry 105 may optionally be electrically coupled to a stress relief apparatus 110 as shown in FIG. 1. The stress relief apparatus 110 shown in FIG. 1 is a general representation of any embodiment as described herein or defined by the claims attached hereto.

Figure 2:
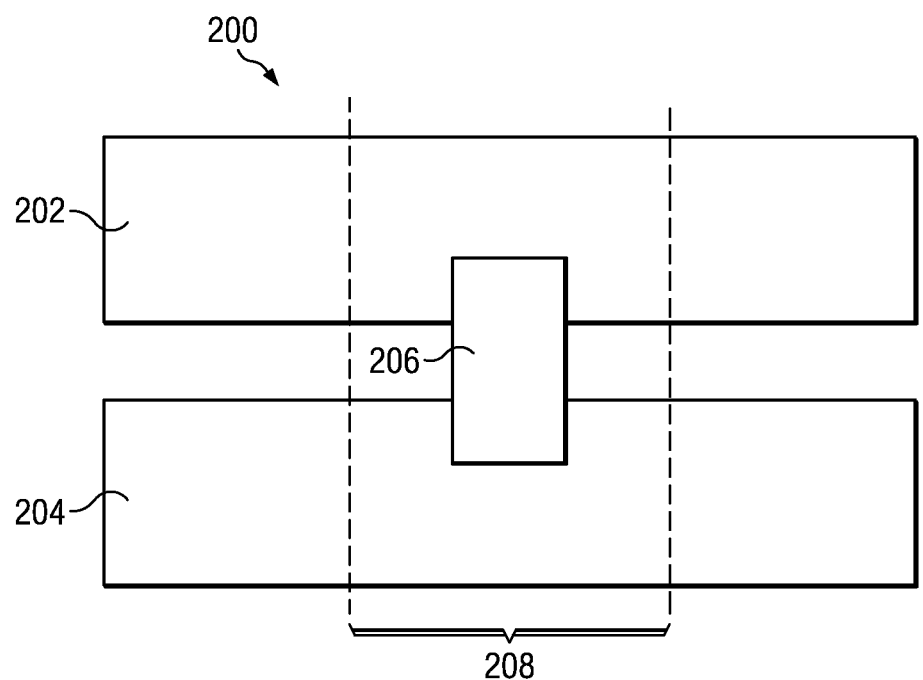
FIG. 2 illustrates an overview of an example embodiment of two chips implementing a stress relief apparatus.

FIG. 2 illustrates an overview of a first example embodiment of the present disclosure, wherein stress relief is provided in a stack 200 comprised of an upper chip 202 and a lower chip 204. In the embodiment illustrated in FIG. 2, a stress relief apparatus 206 (otherwise referred to herein as an "apparatus") provides a coupling between the upper chip 202 and the lower chip 204. In some embodiments, the stress relief apparatus 206 may be comprised of a single unit, or may be comprised of multiple units combined to form the apparatus 206. As is further explained in the multiple embodiments below, the stress relief apparatus 206 is generally disposed within a central region 208 of the chip stack 200, such that the location and design of the stress relief apparatus 206 facilitate movement of at least one of the chips 202 and 204 in response to pressure exerted on the stack 200. The stress relief apparatus 206 may be designed to permit movement of one or both of the chips 202 and 204 in any direction (not just vertically or horizontally) to alleviate the pressure and, thus, relieve stress applied to the chip stack 200. Additionally, in some embodiments of the present disclosure, the stress release apparatus 206 may provide an electrical connection between the upper chip 202 and the lower chip 204, and may even be combined with additional flexible conductors to allow multiple electrical connections between the chips in the stack.

The stress relief apparatus 206 may comprise multiple elements and arrangements as illustrated and described in the multiple embodiments provided throughout the present disclosure. However, it should be understood that the multiple embodiments provided herein are merely examples, and that the example embodiments are not intended to limit the stress relief apparatus, or any other elements of the disclosure, to a specific embodiment. As such, various modifications and additions to the disclosed embodiments may be made without departing from the scope of the invention as defined by the appended claims.

Figure 3A:
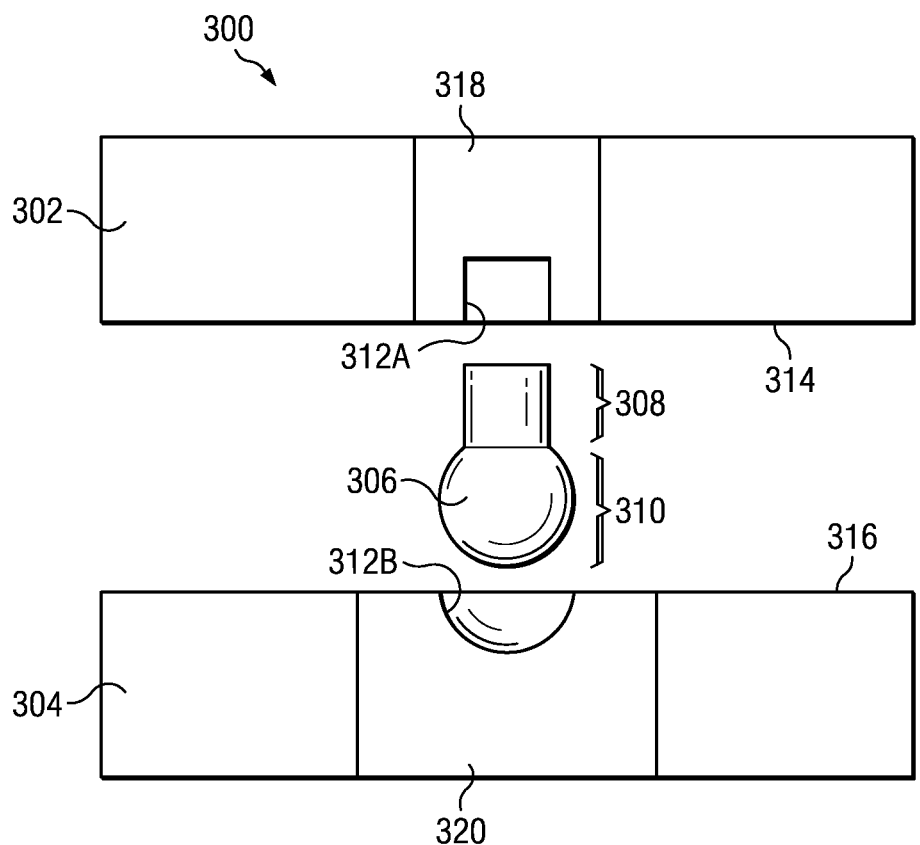
FIGS. 3A and 3B illustrate an example embodiment of a stress relief apparatus.
Figure 3B:
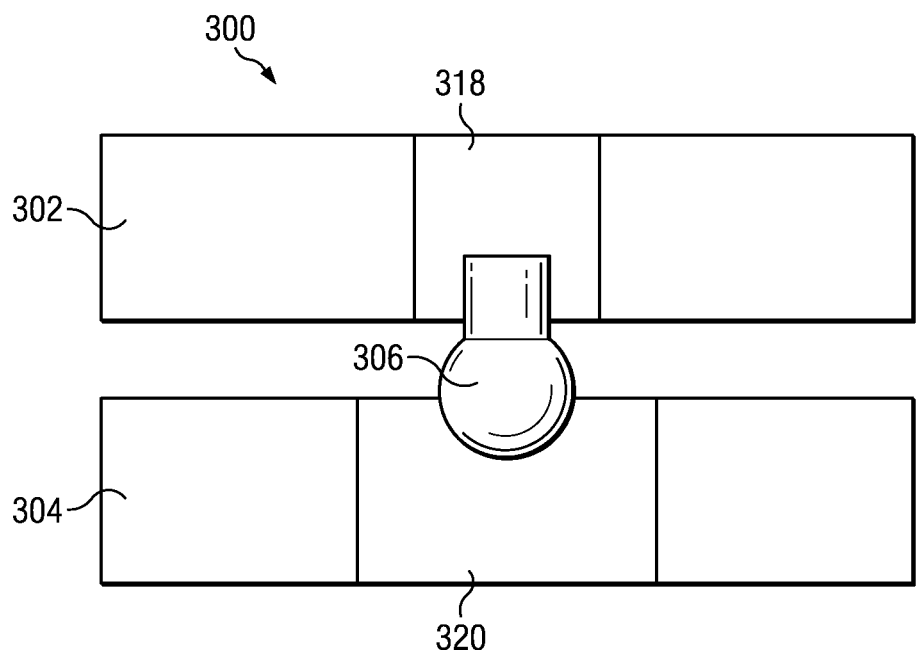

FIGS. 3A and 3B illustrate an example embodiment of the present disclosure, wherein a chip stack 300 is shown to comprise an upper chip 302, lower chip 304, and a "ball-and-rod" stress relief apparatus 306. The "ball-and-rod" apparatus 306 illustrated in FIGS. 3A and 3B may be comprised of a single unit, or may be comprised of multiple units such as a "rod" unit 308 and a "ball" unit 310 combined to form the "ball-and-rod" apparatus 306. The stress relief apparatus 306 may be disposed, at least partially, within recesses 312 (shown in FIG. 3A as upper recess 312A and lower recess 312B) embedded (for example, via etching) within the lower surface 314 of the upper chip 302 and the upper surface 316 of the lower chip 304. As such, the recesses 312 may be designed to conform to an end of a stress relief apparatus 306. For example, the upper recess 312A conforms to the "rod" end of the apparatus 306, while the lower recess 312B conforms to the "ball" end of the apparatus 306. In some embodiments, such as the one illustrated in FIGS. 3A and 3B, the upper chip 302 may include an upper through silicon via (TSV) 318, wherein the upper recess 312A embedded within the upper chip 302 may be embedded within the upper TSV 318. Additionally, the lower chip 304 may include a lower TSV 320, wherein the lower recess 312B embedded within the lower chip 304 may be embedded within the lower TSV 320.

As illustrated in FIG. 3B, the stress relief apparatus 306 may be positioned such that the "rod" section 308 of the apparatus 306 is disposed within the upper recess 312A and is in direct contact with the upper TSV 318, and the "ball" section 310 of the apparatus 306 is disposed within the lower recess 312B and is in direct contact with the lower TSV 320. In some embodiments, this positioning may facilitate an electrical connection between the upper chip 202 and the lower chip 204 through the upper TSV 318, apparatus 306, and lower TSV 320 while also providing stress relief for the chip stack 200. In other embodiments, recesses may be embedded in the substrate, a metallization layer, bonding pad, or any other material located on the surface of a chip.

Figure 4:
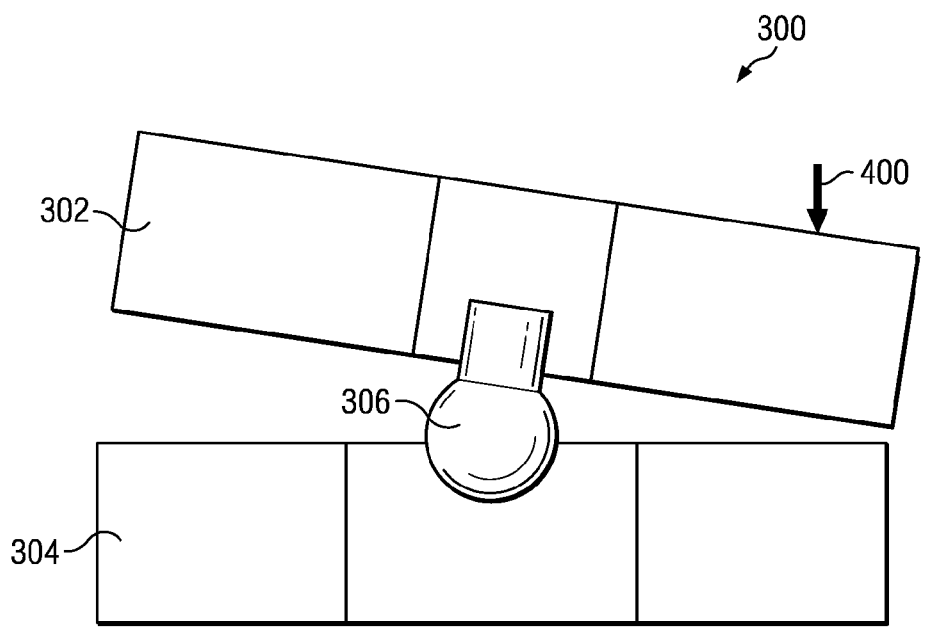
FIG. 4 illustrates an example embodiment wherein pressure applied to the upper chip is relieved by the stress relief apparatus shown in FIGS. 3A and 3B.

FIG. 4 illustrates the example embodiment shown in FIGS. 3A and 3B, wherein pressure 400 applied to the upper chip 302 is relieved by the stress relief apparatus 306. In accordance with the present disclosure, and as illustrated in FIG. 4, the stress relief apparatus 306 facilitates adjusting the positioning of the chip stack 300 in response to the pressure 400 by permitting movement of the upper chip 302 and/or lower chip 304 to relieve stress applied to the chip stack 300 by the pressure 400. Specifically, the pressure 400 applied to the chip stack 300 forces the apparatus 306 to rotate within the lower recess 312B, thereby tilting the upper chip 302 and relieving the stress exerted on the stack 300 by the pressure 400.

Figure 5:
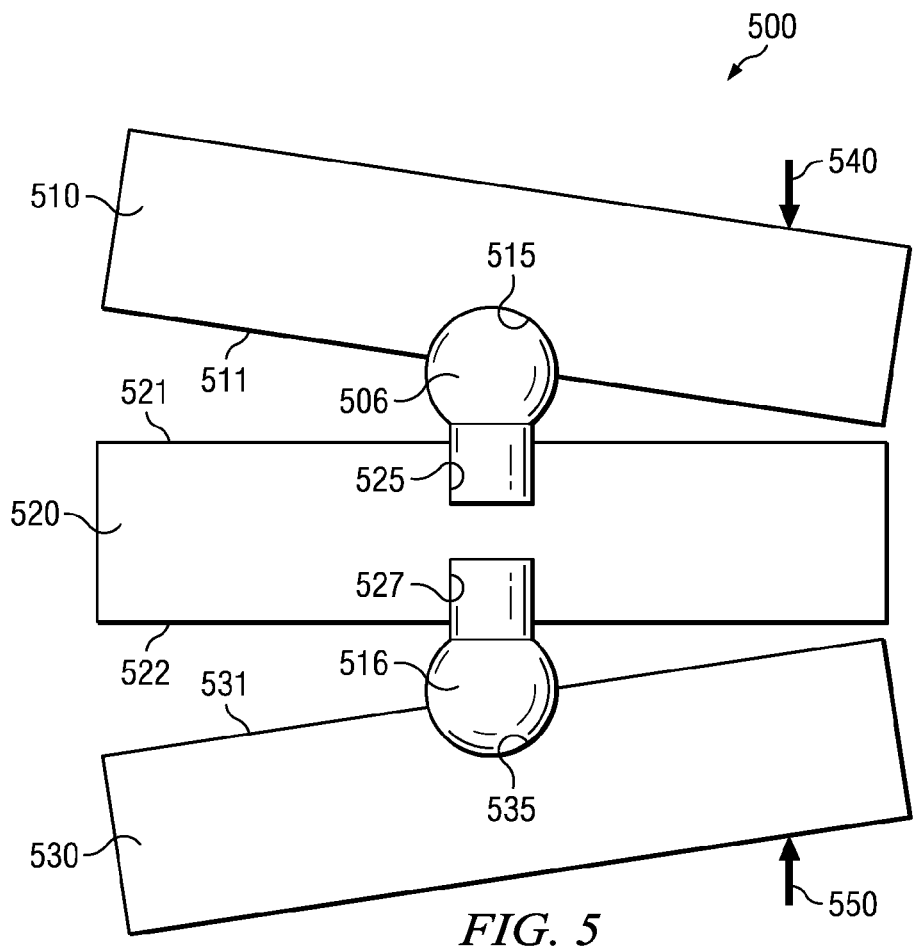
FIG. 5 illustrates an example embodiment of a chip stack implementing one or more stress relief apparatuses.

FIG. 5 illustrates another example embodiment wherein a chip stack 500 is comprised of an upper chip 510, middle chip 520, and lower chip 530. As illustrated in FIG. 5, a stress relief apparatus similar to that shown in FIGS. 3A, 3B, and 4, is provided between each of the chips 510, 520, and 530. In the embodiment shown in FIG. 5, the upper chip 510 includes a recess 515 embedded in the lower surface 511 of the upper chip 510, wherein the recess 515 conforms to the "ball" end of an apparatus 506. The middle chip 520 includes a recess 525 embedded in the upper surface 521 of the middle chip 520, wherein the recess 525 conforms to the "rod" end of the apparatus 506. The middle chip 520 further includes another recess 527 embedded in the lower surface 522 of the middle chip 520, wherein the recess 527 conforms to the "rod" end of an apparatus 516. The lower chip 530 illustrated in FIG. 5 includes a recess 535 embedded in the upper surface 531 of the lower chip 530, wherein the recess 535 conforms to the "ball" end of the apparatus 516.

The embodiment illustrated in FIG. 5 may provide stress relief from pressure applied simultaneously in multiple directions. For example, a downward pressure 540 exerted on the upper chip 510 and an upward pressure 550 exerted on the lower chip 530 stress the chip stack 500. Stress is relieved through the repositioning of the chips as they move about the stress relief apparatuses 506 and 516 to which they are respectively coupled. In the embodiment shown in FIG. 5, the downward pressure 540 applied to the chip stack 500 forces the upper chip 510 to rotate about the rounded "ball" end of the apparatus 506, thereby tilting the upper chip 510 and relieving the stress exerted on the stack 500 by the downward pressure 540. Additionally, the upward pressure 550 forces the lower chip 530 to rotate about the "ball" end of the apparatus 516, thereby tilting the lower chip 530 and relieving the stress exerted on the stack 500 by the upward pressure 550.

Figure 6:
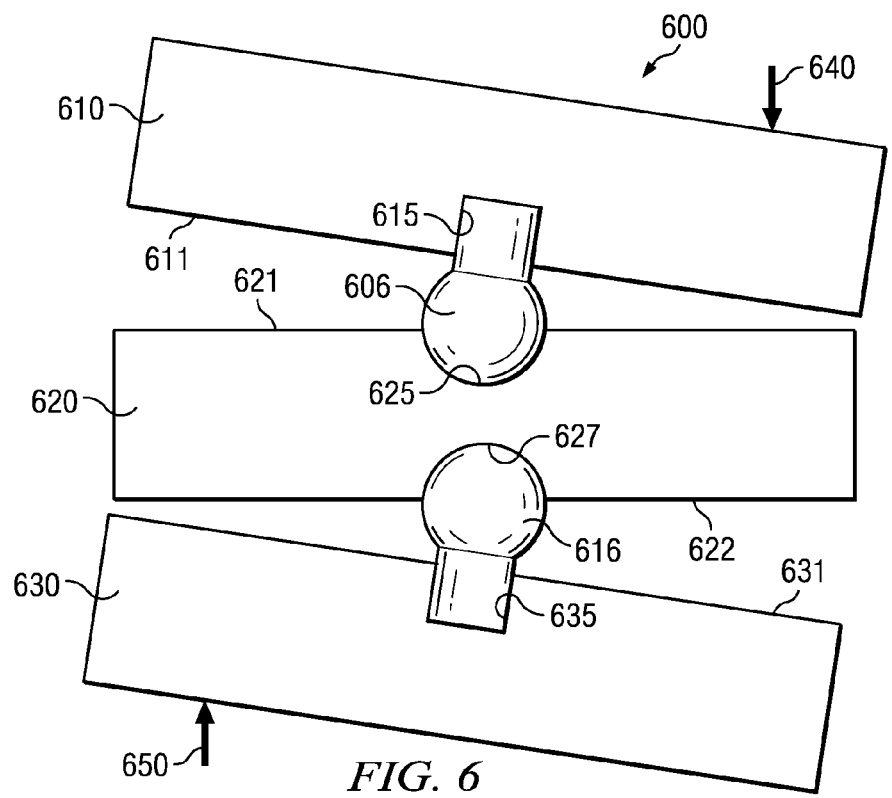
FIG. 6 illustrates an example embodiment of a chip stack implementing one or more stress relief apparatuses.

FIG. 6 illustrates an example embodiment of the present disclosure similar to the embodiment illustrated in FIG. 5. FIG. 6 illustrates a chip stack 600 comprised of an upper chip 610, middle chip 620, lower chip 630, a first stress relief apparatus 606 disposed between the upper chip 610 and the middle chip 620, and a second stress relief apparatus 616 disposed between the middle chip 620 and the lower chip 630. In the embodiment shown in FIG. 6, the upper chip 610 includes a recess 615 embedded in the lower surface 611 of the upper chip 610, wherein the recess 615 conforms to the "rod" end of the apparatus 606. The middle chip 620 includes a recess 625 embedded in the upper surface 621 of the middle chip 620, wherein the recess 625 conforms to the "ball" end of the apparatus 606. The middle chip 620 further includes another recess 627 embedded in the lower surface 622 of the middle chip 620, wherein the recess 627 conforms to the "ball" end of the apparatus 616. The lower chip 630 illustrated in FIG. 6 includes a recess 635 embedded in the upper surface 631 of the lower chip 630, wherein the recess 635 conforms to the "rod" end of the apparatus 616.

The embodiment illustrated in FIG. 6 is similar to that illustrated in FIG. 5, in that the embodiment in FIG. 6 may provide stress relief from pressure applied simultaneously in multiple directions. For example, as shown in FIG. 6, a downward pressure 640 exerted on the upper chip 610 and an upward pressure 650 exerted on the lower chip 630 stress the chip stack 600. The stress is relieved through the repositioning of the chips as they move about the stress relief apparatuses 606 and 616 to which they are respectively coupled. In the embodiment shown in FIG. 6, the downward pressure 640 applied to the chip stack 600 tilts the upper chip 610 and forces the apparatus 606 to rotate within the recess 625, thereby relieving the stress exerted on the stack 600 by the downward pressure 640. Additionally, the upward pressure 650 tilts the lower chip 630 and forces the apparatus 616 to rotate within the recess 627, thereby relieving the stress exerted on the stack 600 by the upward pressure 650. Although it is not illustrated in FIG. 6, the stress relief apparatuses 606 and 616 may also allow the positioning of the middle chip 620 to be adjusted to relieve stress applied to the chip stack 600.

Figure 7:
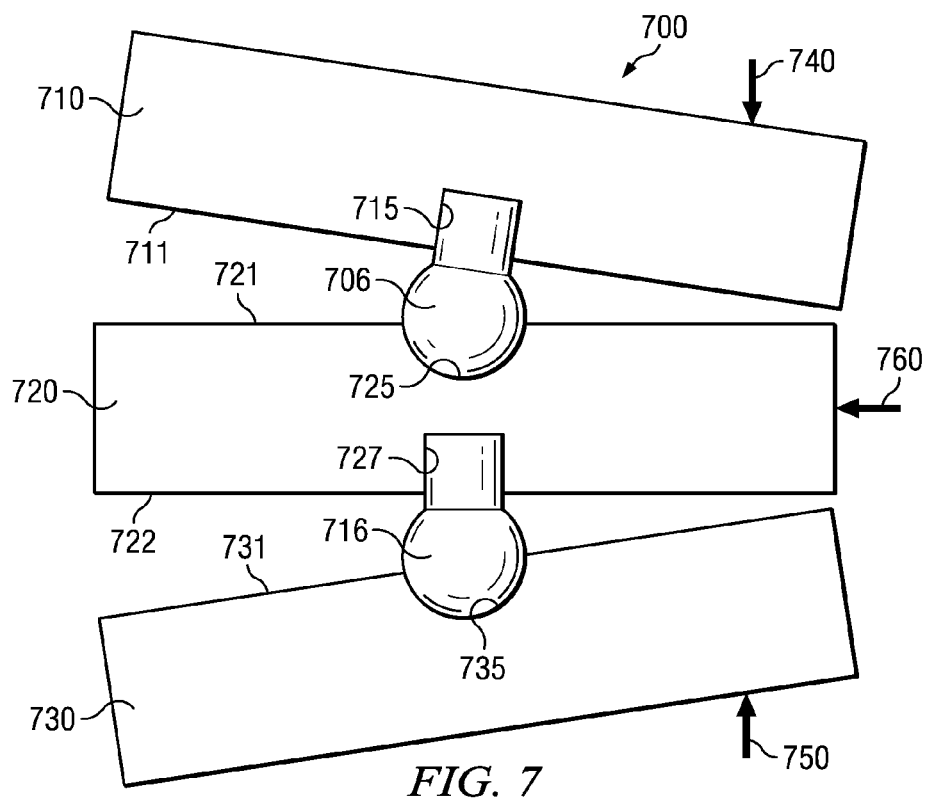
FIG. 7 illustrates an example embodiment of a chip stack implementing one or more stress relief apparatuses.
Figure 8A:
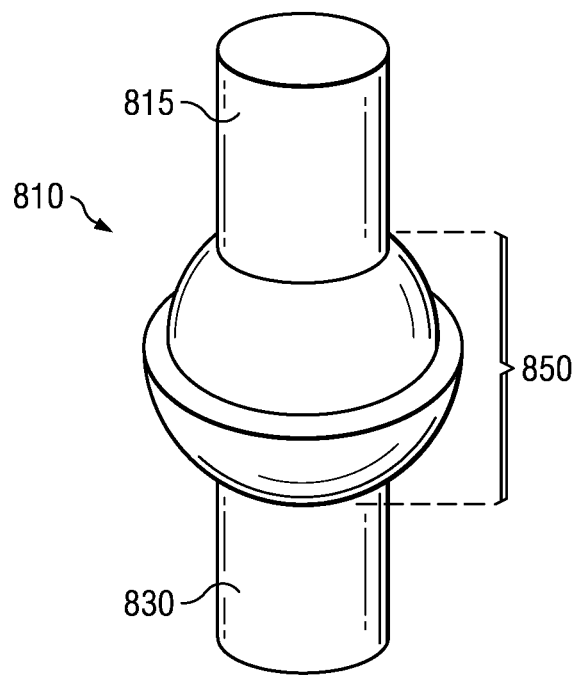
FIGS. 8A and 8B illustrate an example embodiment of a stress relief apparatus implementing an ellipsoid ball-and-socket joint.
Figure 8B:
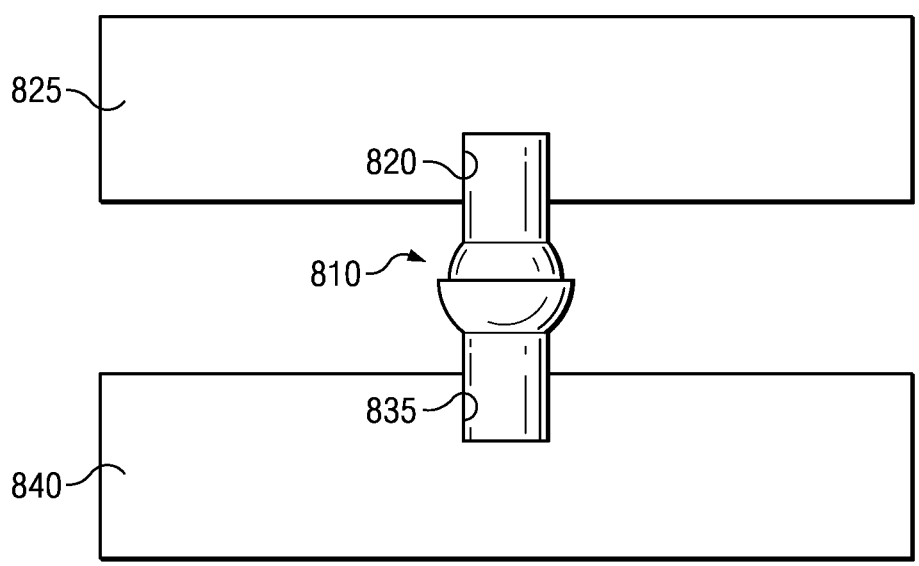
Figure 9A:
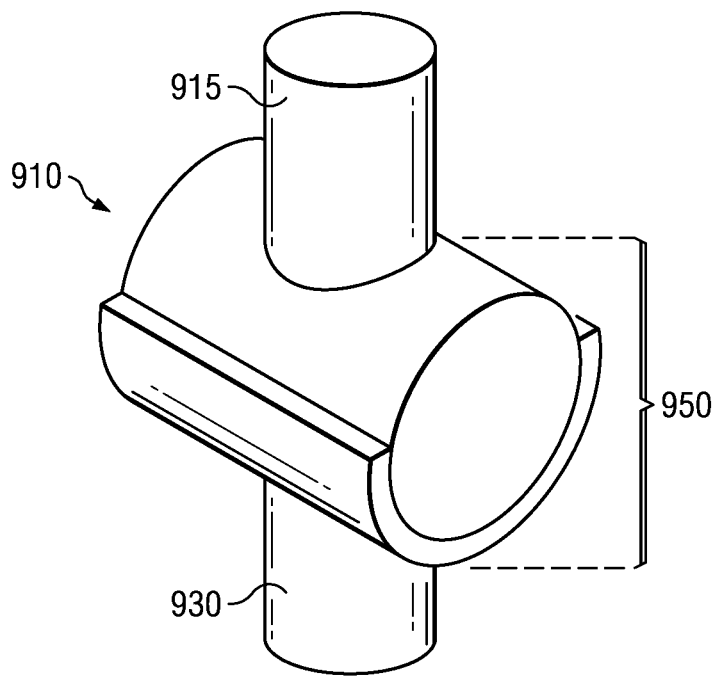
FIGS. 9A and 9B illustrate an example embodiment of a stress relief apparatus implementing a hinge joint.
Figure 9B:
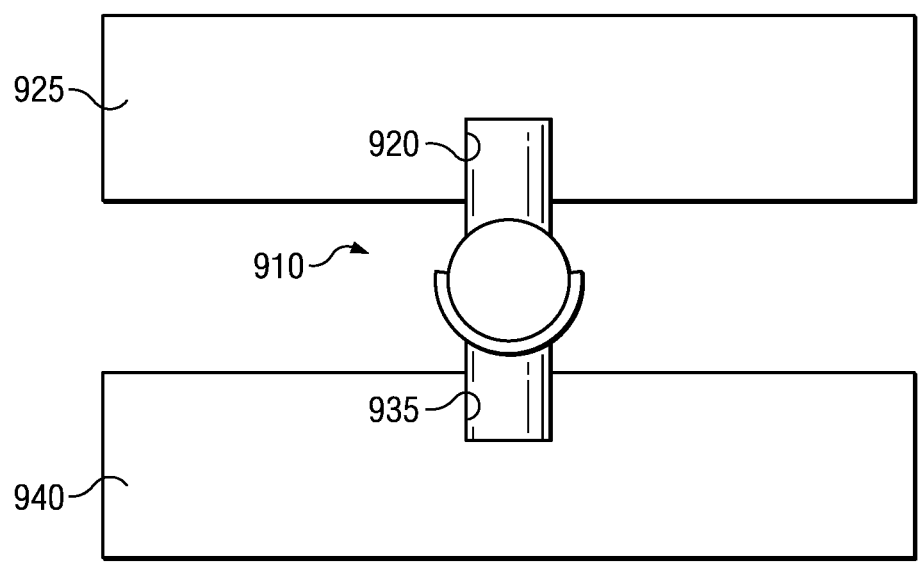
Figure 10A:
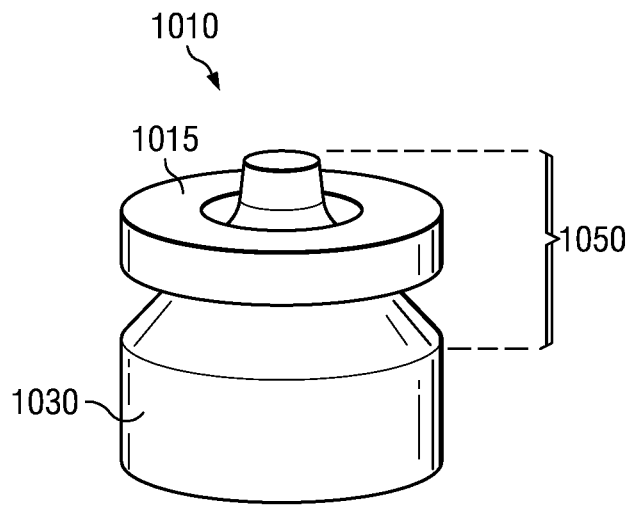
FIGS. 10A and 10B illustrate an example embodiment of a stress relief apparatus implementing a pivot joint.
Figure 10B:
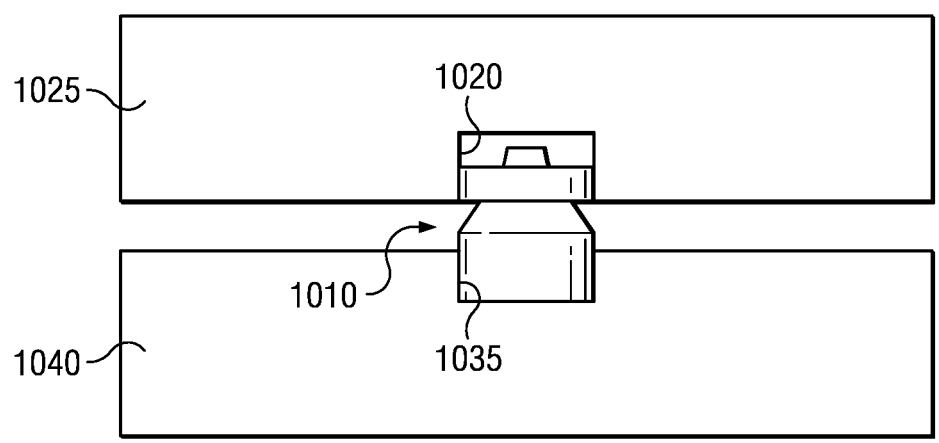
Figure 11A:
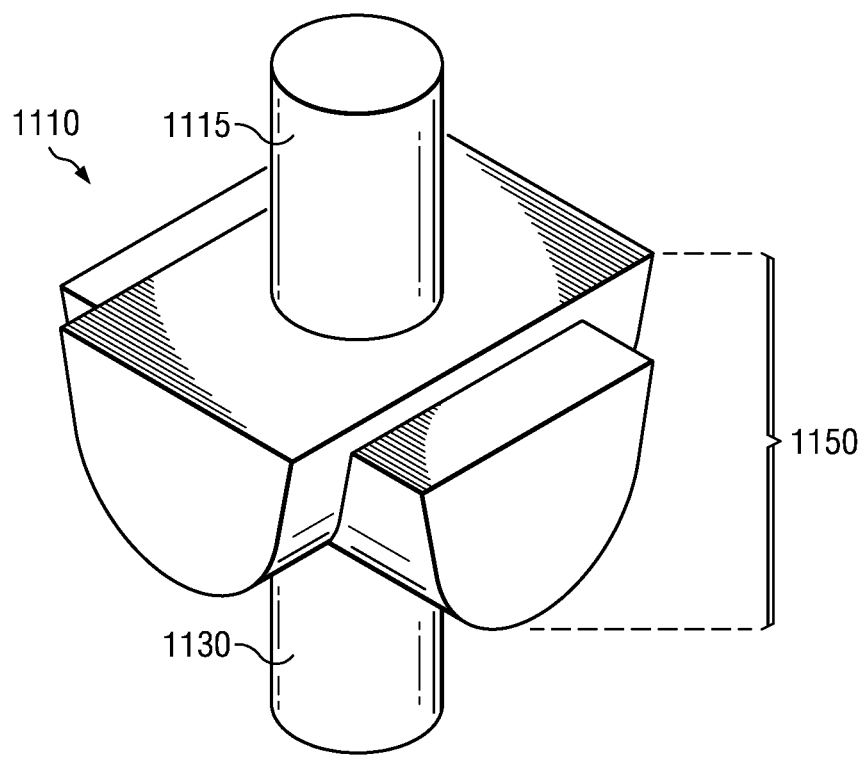
FIGS. 11A and 11B illustrate an example embodiment of a stress relief apparatus implementing a saddle joint.
Figure 11B:
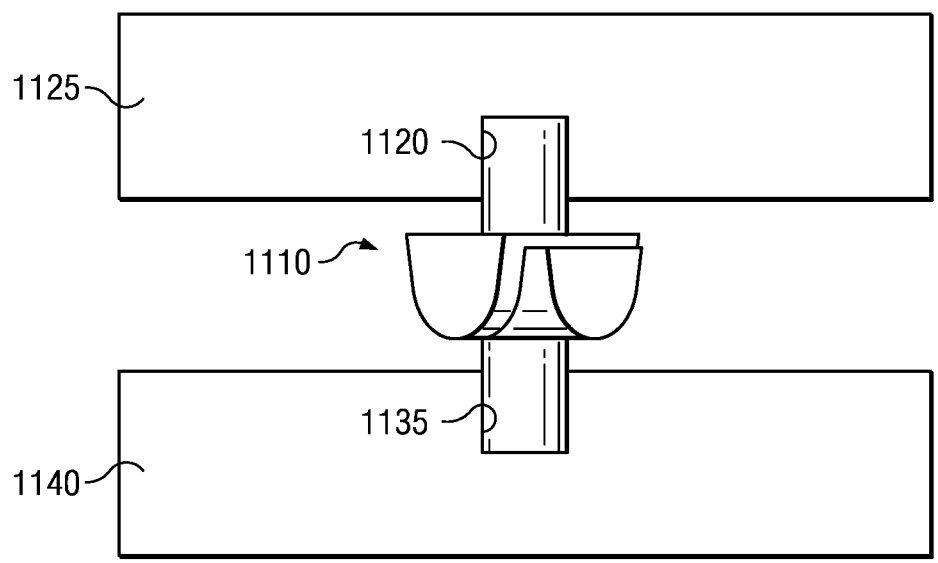

In the embodiment illustrated in FIG. 7, a chip stack 700 is comprised of an upper chip 710, middle chip 720, lower chip 730, a first stress relief apparatus 706 disposed between the upper chip 710 and the middle chip 720, and a second stress relief apparatus 716 disposed between the middle chip 720 and the lower chip 730. The upper chip 710 includes a recess 715 embedded in the lower surface 711 of the upper chip 710, wherein the recess 715 conforms to the "rod" end of apparatus 706. The middle chip 720 includes a recess 725 embedded in the upper surface 721 of the middle chip 720, wherein the recess 725 conforms to the "ball" end of the apparatus 706. The middle chip 720 further includes another recess 727 embedded in the lower surface 722 of the middle chip 720, wherein the recess 727 conforms to the "rod" end of the apparatus 716. The lower chip 730 illustrated in FIG. 7 includes a recess 735 embedded in the upper surface 731 of the lower chip 730, wherein the recess 735 conforms to the "ball" end of the apparatus 716.

The embodiment illustrated in FIG. 7 is similar to those illustrated in FIGS. 5 and 6, in that the embodiment in FIG. 7 may provide stress relief from pressure applied simultaneously in multiple directions. In the example shown in FIG. 7, a downward pressure 740 exerted on the upper chip 710, an upward pressure 750 exerted on the lower chip 730, and a horizontal pressure 760 exerted on the middle chip 720 apply stress to the chip stack 700. The stress is relieved through the repositioning of the chips as they move about the stress relief apparatuses 706 and 716 to which they are respectively coupled. In the embodiment shown in FIG. 7, the downward pressure 740 applied to the chip stack 700 tilts the upper chip 710 and forces the apparatus 706 to rotate within the recess 725, thereby relieving the stress exerted on the stack 700 by the downward pressure 740. The upward pressure 750 tilts the lower chip 730, forcing it to rotate about the round end of the apparatus 716, thereby relieving the stress exerted on the stack 700 by the upward pressure 750. Additionally, the horizontal pressure 760 applied to the middle chip 720 displaces the middle chip 720 along the direction of the horizontal pressure 760, thereby causing the apparatus 706 to rotate within the recess 725, which also causes the upper chip 710 to tilt even more and also become displaced along a horizontal direction opposite the horizontal pressure 760. Additionally, the horizontal displacement of the middle chip 720 also relieves stress applied to the chip stack 700 by causing the ball end of apparatus 716 to rotate within the recess 735, which may cause the lower chip 730 to tilt even more and also become displaced along a horizontal direction opposite the horizontal pressure 760. The foregoing displacement of the middle chip 720 relieves stress applied to the chip stack 700.

It should be understood that the scope of the invention is not limited to the embodiments disclosed herein. As such, portions of the disclosed embodiments may be combined to generate additional embodiments without departing from the scope of the present disclosure. Additionally, the manner in which the adjusting is shown and/or described is not meant to limit the invention in any way to one particular direction or manner of adjusting. Pressure may be applied to any chip(s) from any angle or direction, and any chip(s) may be permitted by a stress relief apparatus to be tilted, rotated, horizontally displaced, vertically displaced, or otherwise adjusted in any direction, thereby relieving pressure applied to the chip stack.

The combination of chips, recesses, and stress relieving apparatuses provided in the text and figures are not meant to limit the invention to a particular configuration. As such, a stress relief apparatus may be disposed in a recess that is located within any component located on the surface of the chip such as, for example, a TSV, metallization layer, bonding pad, or any other material located on the surface of the chip, including the substrate. Additionally, any recess, apparatus, and chip configuration may be implemented without limiting the apparatus to a "ball-and-rod" apparatus, and without limiting the recess to coupling or conforming to a "ball" end or a "rod" end. Accordingly, the stress relief apparatus may have ends of various sizes and shapes, and the recesses may be designed to accommodate any shape or size of any end of an apparatus with any fit, as described below. Additionally, some stress relief apparatuses may be designed to provide a particular range of motion, wherein the range of motion may be determined by the size, shape, design, and/or fit of the apparatus within a recess. In some embodiments, various ranges of motion may be provided by apparatuses having joints that couple the ends of an apparatus as illustrated in FIGS. 8-11.

The example embodiments of the disclosed stress relief apparatuses shown in FIGS. 8-11 are provided to illustrate apparatuses, and accompanying recesses, of various sizes and shapes. Additionally, the apparatuses provide various ranges of motion by using different joints to create a couple between the ends of the apparatuses (as mentioned above, apparatuses may comprise a single unit or may be comprised of multiple units coupled to form the apparatus). FIGS. 8A and 8B illustrate a stress relief apparatus 810 having a first rod end 815 disposed within a first recess 820 in an upper chip 825 and a second rod end 830 disposed within a second recess 835 in a lower chip 840, wherein an ellipsoid ball-and-socket joint 850 provides a couple between the first and second rod ends 815 and 830. FIGS. 9A and 9B illustrate a stress relief apparatus 910 having a first rod end 915 disposed within a first recess 920 in an upper chip 925 and a second rod end 930 disposed within a second recess 935 in a lower chip 940, wherein a gliding hinge joint 950 provides a couple between the first and second rod ends 915 and 930. FIGS. 10A and 10B illustrate a stress relief apparatus 1010 having a first rod end 1015 disposed within a first recess 1020 in an upper chip 1025 and a second rod end 1030 disposed within a second recess 1035 in a lower chip 1040, wherein a pivot joint 1050 provides a couple between the first and second rod ends 1015 and 1030. FIGS. 11A and 11B illustrate an apparatus 1110 having a first rod end 1115 disposed within a first recess 1120 in an upper chip 1125 and a second rod end 1130 disposed within a second recess 1135 in a lower chip 1140, wherein a saddle joint 1150 provides a couple between the first and second rod ends 1115 and 1130. Although an end of an apparatus shown in some of the above embodiments may have a cross-sectional shape of a circle, it should be understood that the cross-sectional shape of an end of any apparatus, and any recess conforming to any apparatus provided within the present disclosure, is not limited to any one size or shape and may include, but is not limited to, a circle, rectangle, oval, triangle, hexagon, star, toroid, torus, etc.

Figure 12A:
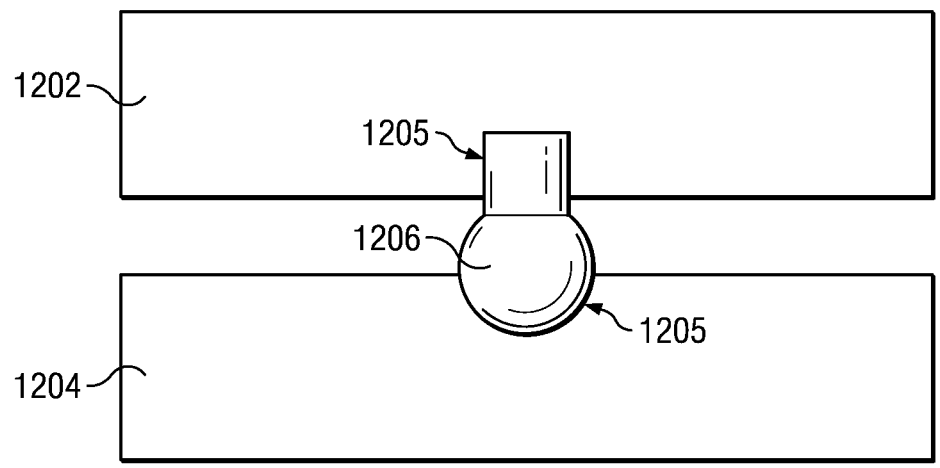
FIGS. 12A and 12B illustrate example embodiments of a stress relief apparatus having an interference fit and a loose fit, respectively.
Figure 12B:
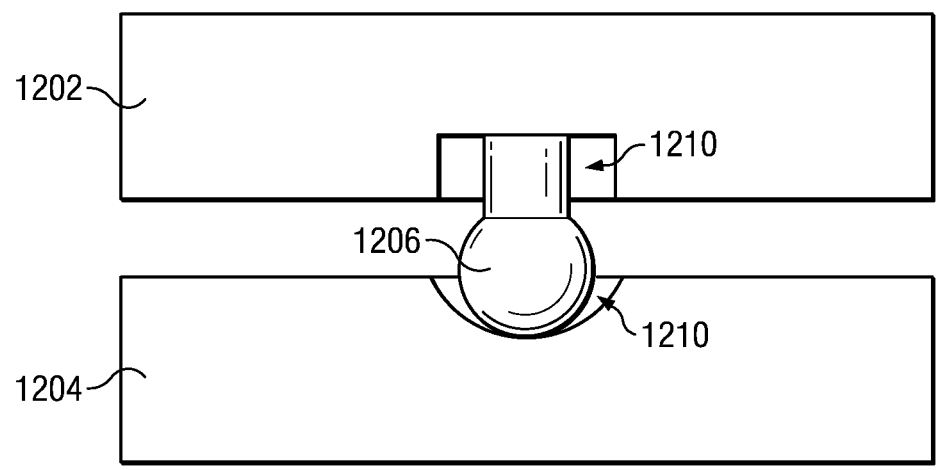

It should be noted that there may be multiple fits created by bonding or adhering an end of an apparatus within the recess of a chip. One such fit includes an interference fit 1205, as shown in FIG. 12A, wherein an end of an apparatus 1206 is disposed within a recess such that the end of the apparatus 1206 may be allowed limited movement within the recess, thereby limiting movement of the chip 1202 relative to the position of the end of the apparatus 1206. Another fit includes a loose fit 1210, as illustrated generally in FIG. 12B, whereby the recess and/or apparatus 1206 are designed such that an end of the apparatus 1206 is loosely fitted within the recess, thereby permitting greater movement of the end of the apparatus 1206 within the recess to accommodate movement of the chip 1202 or 1204 relative to the position of the end of the apparatus 1206. Although in some embodiments it may be preferable to use one fit over another, any fit may be used with any of the embodiments provided within the present disclosure.

Figure 13A:
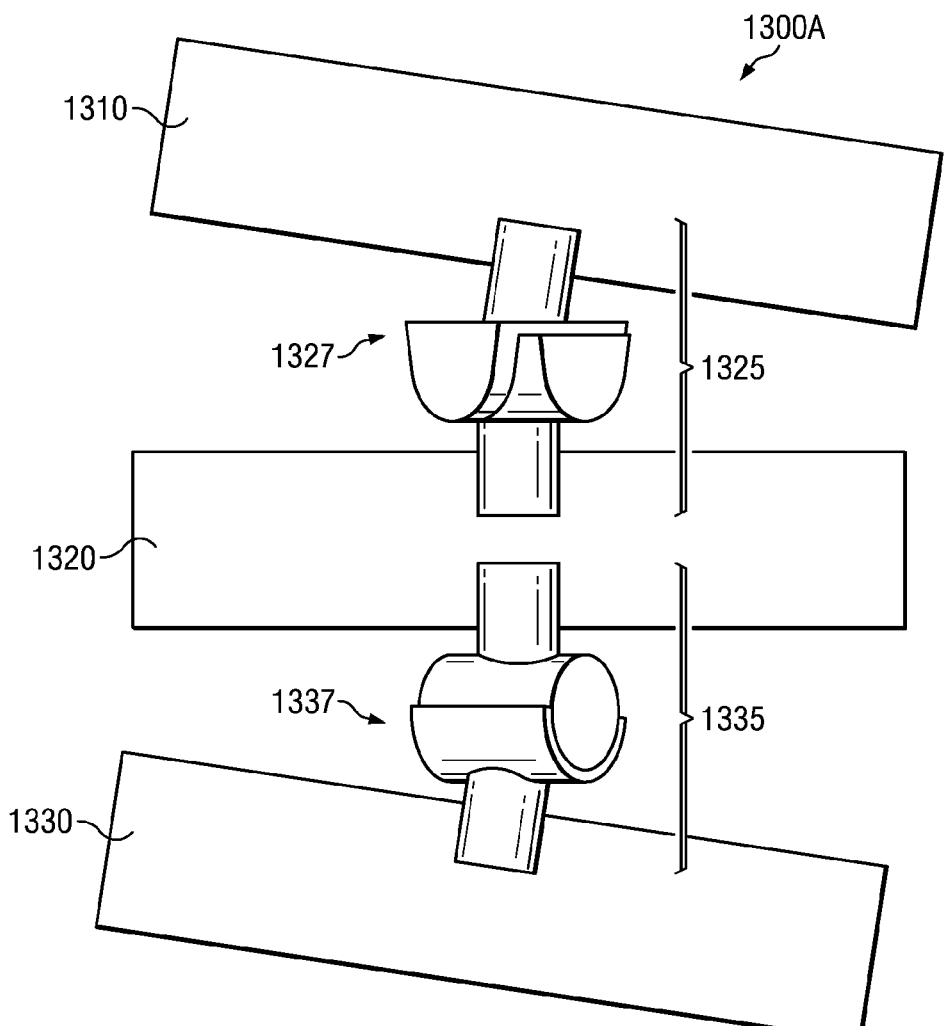
FIGS. 13A and 13B illustrate example embodiments of chip stacks implementing a combination of example stress relief apparatuses.
Figure 13B:
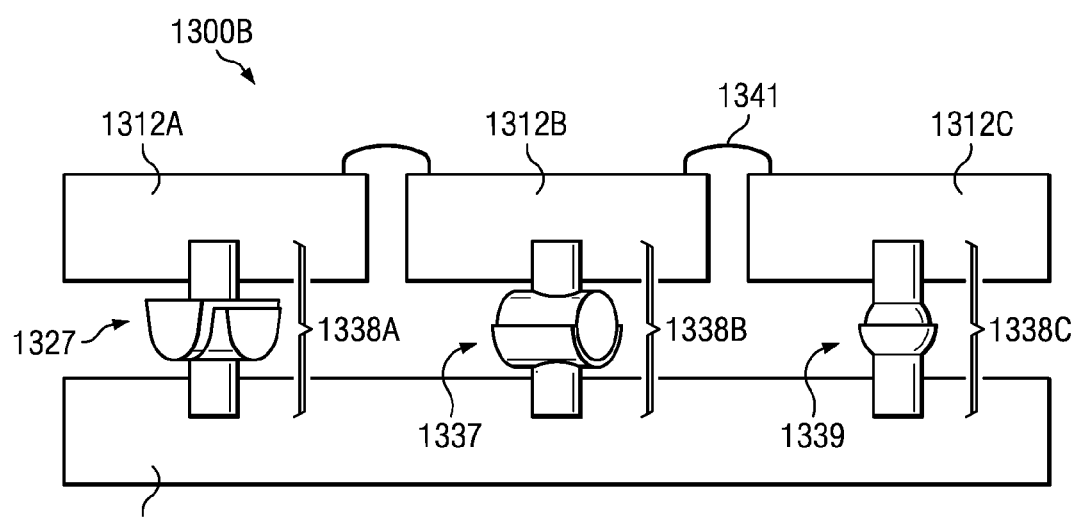

Multiple embodiments and variations of the stress relief apparatus may be used within a single chip stack. Since various embodiments of the stress relief apparatus may offer different ranges of motion, particular stress relief apparatuses may be combined for a number of reasons such as, for example, to optimize the spatial relationship between chips in a chip stack. For example, FIGS. 13A and 13B illustrate example embodiments of chip stacks 1300A and 1300B, wherein in FIG. 13A an upper chip 1310 is coupled to a middle chip 1320 by a stress relief apparatus 1325 having a saddle joint 1327, and the middle chip 1320 is coupled to a lower chip 1330 by a stress relief apparatus 1335 having a gliding hinge joint 1337. In FIG. 13B, multiple upper chips 1312A, 1312B, and 1312C are each coupled to a lower chip 1322 by respective stress relief apparatuses 1338A, 1338B, and 1338C, having a saddle joint 1327, gliding hinge joint 1337, and ellipsoid ball-and-socket joint 1339, respectively. In accordance with these example embodiments, the chip manufacturer may choose to utilize different stress relief apparatuses (1325, 1335, 1338A, 1338B, and 1338C) to provide different ranges of motion between the chips in the chip stacks 1300A and 1300B. It should be understood that the combinations of stress relief apparatuses provided in these example embodiments are not limited to those illustrated in FIGS. 13A or 13B. As such, any combination of stress relief apparatuses may be implemented within a chip stack without departing from the scope of the present disclosure. Also, in accordance with the example embodiment illustrated in FIG. 13B, multiple adjacent chips such as, for example, upper chips 1312A, 1312B, and 1312C may be electrically coupled to each other through various means including, but not limited to, a wire bond 1341 or an electrical connection provided between the adjacent chips 1312A, 1312B, and 1312C and the lower chip 1322.

Figure 14:
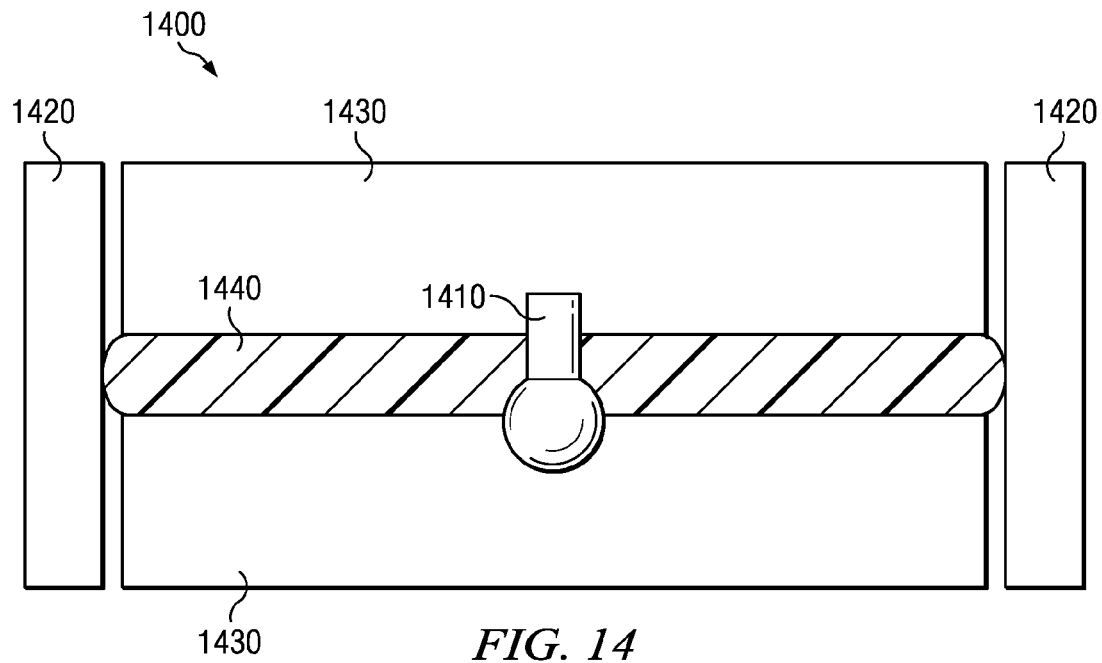
FIG. 14 illustrates an example embodiment for providing improved heat dispersion management in a 3D chip stack.

Another embodiment of the present disclosure provides improved heat management in a 3D chip stack. FIG. 14 provides an example embodiment of a chip stack 1400 implementing an example stress relief apparatus 1410 as provided in an example embodiment described above, wherein improved heat management is provided by implementing heat sink walls 1420 disposed along the outside surfaces of the chips 1430 and an elastic thermal material 1440 disposed between the heat sink walls 1420 and chips 1430 of the chip stack 1400. The heat sink walls 1420 are designed to absorb or conduct thermal energy, and may be generally comprised of a heat-absorbing, or thermally-conductive, material such as, for example, ceramic-based paint offering thermal radiation characteristics for heat dissipation. The elastic thermal material 1440 is generally comprised of a thermally-reactive material that expands locally in response to an increase in temperature. Examples of an elastic thermal material 1440 may include sol-gel prepared materials such as, for example, Silica xerogels and Aerogels. It should be understood that the heat sink walls and elastic thermal material are not limited to the example materials provided above.

Figure 15:
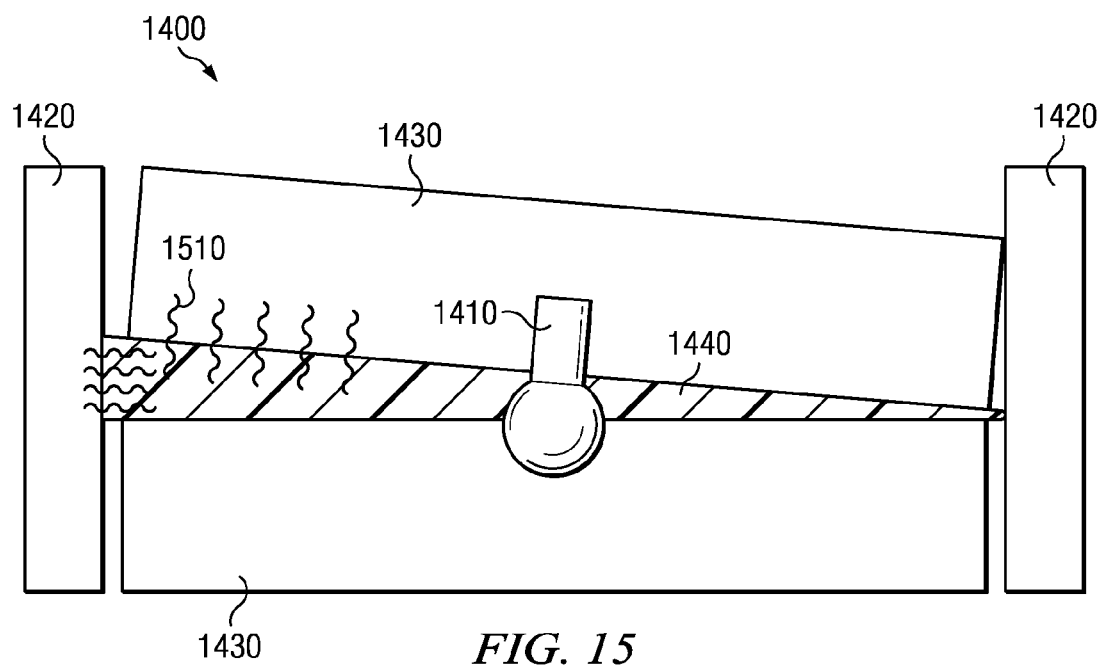
FIG. 15 illustrates heat dispersion for the embodiment shown in FIG. 14.

In one embodiment, improved heat management may be provided as illustrated in FIG. 15. Thermal energy 1510 (otherwise referred to herein as heat) produced by the circuitry (not shown) on the chips 1430 causes at least a portion of the elastic thermal material 1440 to expand at the location at which the heat is received by the elastic thermal material 1440. The local expansion of the elastic thermal material 1440 adjusts the positioning of the chip stack 1400 to allow the heat 1510 generated by the circuitry to transfer from the elastic thermal material 1440 disposed between the chips 1430 to the heat sink walls 1420 where it is dissipated from the chip stack 1400. Because the heat generated by the circuitry is removed from between the chips 1430 through the adjusting of the chip stack 1400 and subsequent dissipation by the heat sink walls 1420, thermal throttling is unnecessary, and thus, the circuitry is able to operate as desired without sacrificing performance of the chip stack 1400. In addition to providing improved heat management, the embodiment illustrated in FIGS. 14 and 15 is operable to provide stress relief by adjusting the position of the chip stack 1400 in response to pressure, as described in accordance with the foregoing embodiments. Accordingly, the example embodiment provided herein provides stress relief within the chip stack 1400 while also allowing for improved heat dispersion management by removing heat from the chip stack without sacrificing performance.

Figure 16:
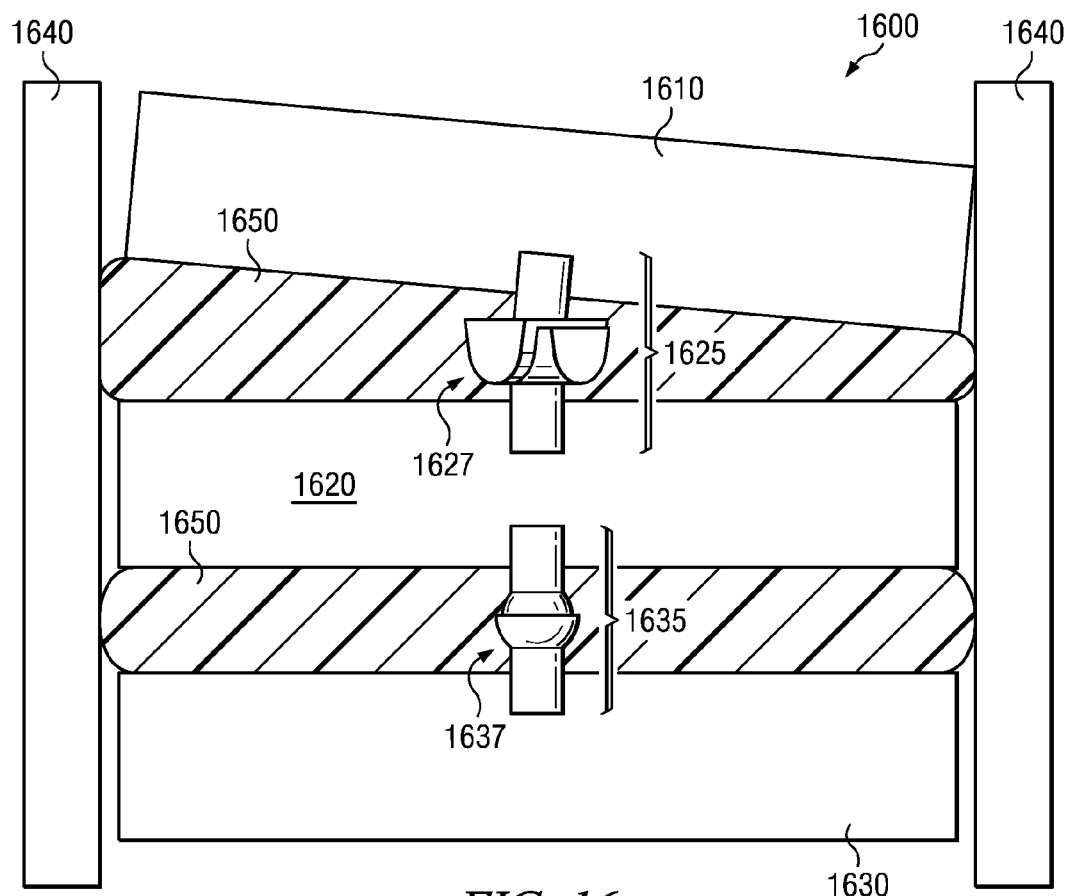
FIG. 16 illustrates an example embodiment for providing heat dispersion management in a 3D chip stack.

It should be appreciated by those of ordinary skill in the art that improved heat management is not limited to the embodiment illustrated in FIGS. 14 and 15. In fact, improved heat management may be applied to any of the embodiments and stress relief apparatuses disclosed herein without departing from the spirit and scope of the present disclosure as defined by the claims below. One such example embodiment is illustrated in FIG. 16, wherein a chip stack 1600 includes an upper chip 1610 coupled to a middle chip 1620 by a stress relief apparatus 1625 having a saddle joint 1627, and a lower chip 1630 coupled to the middle chip 1620 by a stress relief apparatus 1635 having an ellipsoid ball-and-socket joint 1637. Additionally, the chip stack 1600 incorporates improved heat management through the implementation of heat sink walls 1640 disposed along the outside surfaces of the chips 1610, 1620 and 1630, and elastic thermal material 1650 disposed between the chips in accordance with the foregoing discussion.

Figure 17:
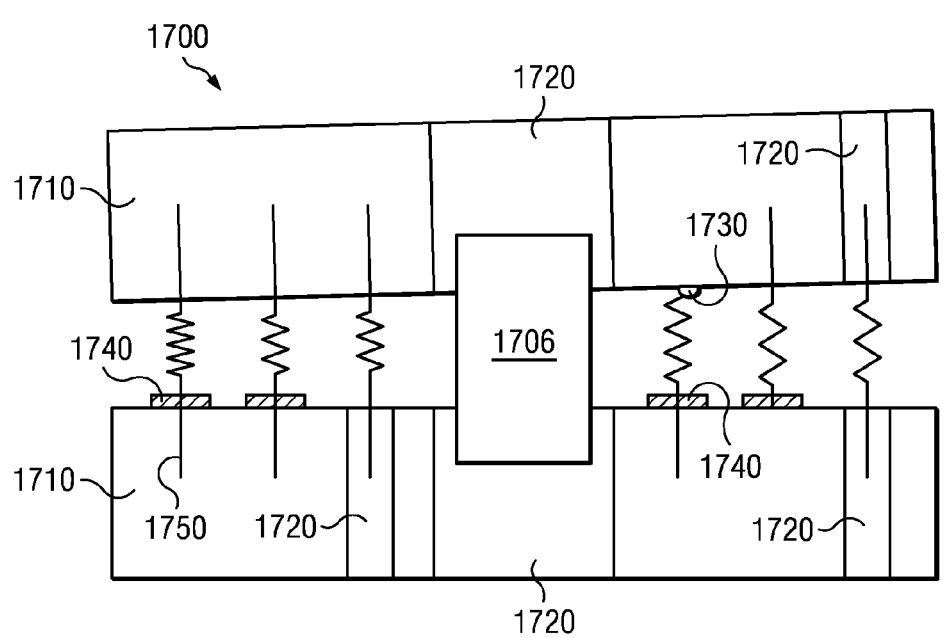
FIG. 17 illustrates an example embodiment of a chip stack incorporating flexible conductors.

In yet another embodiment of the present disclosure, signals may be communicated through the chips in a chip stack through an array of inter-stack connectors, or flexible conductors, connected between two chips, as illustrated in FIG. 17. FIG. 17 illustrates an example embodiment in accordance with the present disclosure, wherein multiple flexible conductors 1750 are disposed in an array between chips 1710 in a chip stack 1700. In some embodiments, as shown in FIG. 17, the ends of some or all of the flexible conductors 1750 may be connected to a component located within the chip 1710 such as for example, a TSV 1720, the chip substrate, or other circuitry located within the chip 1710. Additionally, the ends of some or all of the flexible conductors 1750 may be connected to a component located on the surface of a chip 1710 such as, for example, a bonding pad 1730, a metallization layer 1740, or other circuitry located on the surface of a chip 1710. Flexible conductors 1750 are designed to adjust with the chips 1710 to which they are connected while also conducting an electrical signal between two chips 1710. Flexible conductors 1750 may include a conductive spring such as, for example, a coil spring, leaf spring, or the like, or, the flexible conductors 1750 may even include carbon nanotubes (CNT). In addition to using flexible conductors 1750, an electrical signal may be conducted between two chips 1710 via the stress relief apparatus 1706. It should be appreciated by one of ordinary skill in the art that the flexible conductors 1750 may be incorporated in any of the embodiments provided herein without departing from the scope of the present disclosure.

Figure 18A:
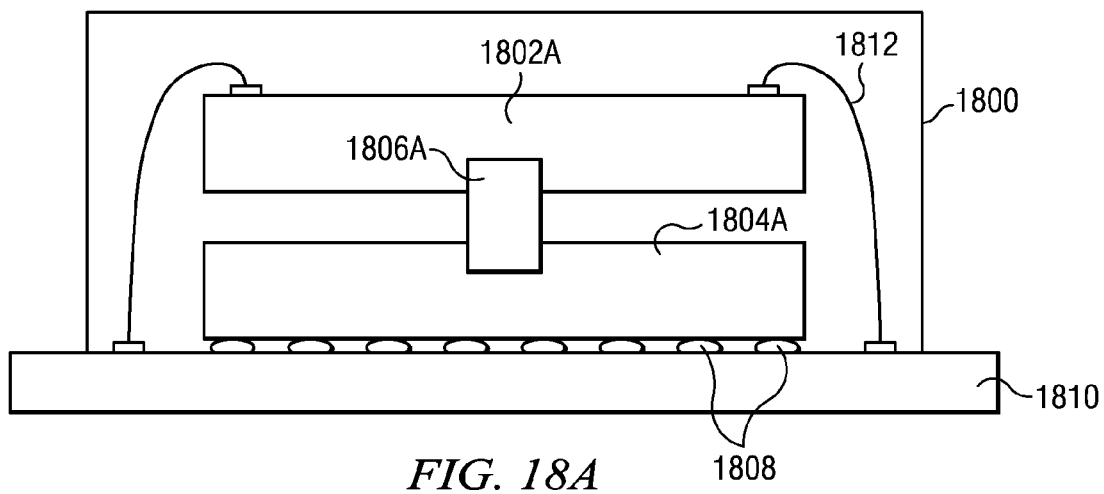
FIGS. 18A and 18B illustrate a cross-sectional view of an example electronic package incorporating one or more example embodiments.
Figure 18B:
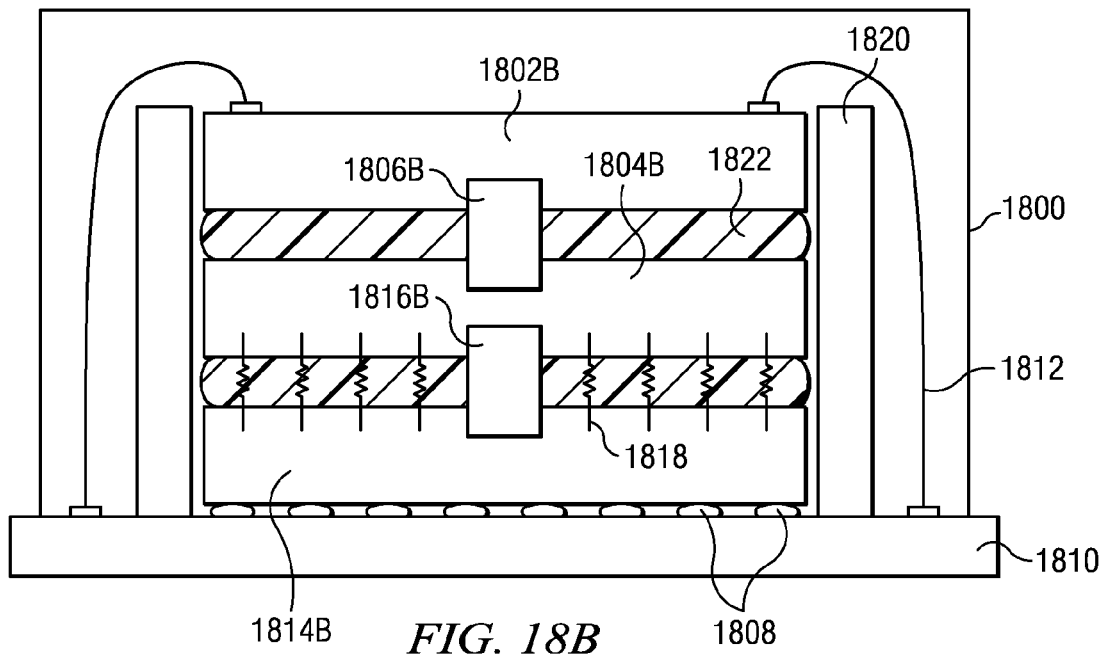

FIG. 18A-18B are provided to illustrate a cross-sectional view of an example electronic package 1800 incorporating one or more of the embodiments provided throughout the present disclosure, wherein the electronic package 1800 is installed on a circuit board 1810. In FIG. 18A, the electronic package 1800 is illustrated to show an example chip stack comprised of an upper chip 1802A connected to a lower chip 1804A by an example stress relief apparatus 1806A, wherein the lower chip 1804A is connected to the circuit board 1810 by bonding pads 1808, and the upper chip 1802A is connected to the circuit board 1810 via wire bonding 1812. In the example embodiment illustrated in FIG. 18B, the electronic package 1800 comprises an upper chip 1802B connected to a middle chip 1804B by an example stress relief apparatus 1806B, and the middle chip 1804B is connected to a lower chip 1814B by a second example stress relief apparatus 1816B and flexible conductors 1818. The electronic package 1800 illustrated in FIG. 18B further comprises heat sink walls 1820 and thermal elastic material 1822. In the example embodiment illustrated in FIG. 18B, the upper chip 1802B is connected to the circuit board 1810 via wire bonding 1812, the lower chip 1814B is connected to the circuit board 1810 via bonding pads 1808, and the middle chip 1804B communicates with the circuit board 1810 through the flexible conductors 1818 and the lower chip 1814B. The example embodiments illustrated in FIGS. 18A and 18B are provided to illustrate an example electronic package incorporating one or more of the embodiments provided throughout the present disclosure. As such, it should be understood that any of the embodiments provided herein may be similarly incorporated in an electronic package without departing from the spirit and scope of the present disclosure and defined in the claims below.

What is claimed is:

1. A 3D chip stack comprising:
    a first chip having a first recess disposed along a lower surface of said first chip;
    a second chip having a second recess disposed along an upper surface of said second chip;
    a stress relief apparatus having a first end disposed within said first recess and a second end disposed within said second recess, said stress relief apparatus adapted to permit movement of the first and second chips relative to each other in response to an applied stress; and
    a first set of one or more flexible conductors disposed between said first chip and said second chip, each of said one or more flexible conductors in said first set adapted to provide an electrical connection between said first and second chips.

2. The 3D chip stack as set forth in claim 1, wherein at least one of said one or more flexible conductors in said first set comprises a carbon nanotube.

3. The 3D chip stack as set forth in claim 1, wherein at least one of said one or more flexible conductors in said first set comprises a spring.

4. The 3D chip stack as set forth in claim 1, wherein at least one end of at least one of said one or more flexible conductors in said first set is adapted to be disposed within a through silicon via.

5. The 3D chip stack as set forth in claim 1, wherein said first chip further comprises a first through silicon via, and said first recess is disposed within said first through silicon via.

6. The 3D chip stack as set forth in claim 5, wherein said second chip further comprises a second through silicon via, and said second recess is disposed within said second through silicon via.

7. The 3D chip stack as set forth in claim 1, wherein said stress relief apparatus provides an electrical connection between said first chip and said second chip in addition to the first set of flexible conductors.

8. The 3D chip stack as set forth in claim 1, wherein said first recess is shaped to conform to said first end of said stress relief apparatus.

9. The 3D chip stack as set forth in claim 1, wherein said second recess is shaped to conform to said second end of said stress relief apparatus.

10. The 3D chip stack as set forth in claim 1, wherein at least one of said first recess or said second recess provides an interference fit.

11. The 3D chip stack as set forth in claim 1, wherein at least one of said first recess or said second recess provides a loose fit.

12. The 3D chip stack as set forth in claim 1, wherein said first end of said stress relief apparatus is a rod.

13. The 3D chip stack as set forth in claim 1, wherein said second end of said stress relief apparatus is an ellipsoid.

14. The 3D chip stack as set forth in claim 1, wherein said stress relief apparatus further comprises an ellipsoid ball-and-socket joint connected between said first end and said second end.

15. The 3D chip stack as set forth in claim 1, wherein said stress relief apparatus further comprises a hinge joint connected between said first end and said second end.

16. The 3D chip stack as set forth in claim 1, wherein said stress relief apparatus further comprises a pivot joint connected between said first end and said second end.

17. The 3D chip stack as set forth in claim 1, wherein said stress relief apparatus further comprises a saddle joint connected between said first end and said second end.

18. The 3D chip stack as set forth in claim 1, further comprising:
an elastic thermal material disposed between said first and second chips, said elastic thermal material adapted to expand in response to thermal energy generated by at least one of said first or second chips; and
a thermally-conductive material disposed along the outside surfaces of said first chip, said second chip, and said elastic thermal material, said thermally-conductive material adapted to receive thermal energy from said elastic thermal material, and dissipate said thermal energy from said chip stack.

19. The 3D chip stack as set forth in claim 1, wherein said one or more flexible conductors in said first set are adapted to be disposed in an array between said first chip and said second chip.

20. The 3D chip stack as set forth in claim 1, further comprising:
a third chip having a third recess disposed along a lower surface of said third chip;
a second stress relief apparatus having a first end coupled to said third recess and a second end coupled to a fourth recess, said fourth recess disposed along the upper surface of said second chip, and said second stress relief apparatus adapted to permit movement of the third and second chips relative to each other in response to an applied stress; and
a second set of one or more flexible conductors disposed between said third chip and said second chip, each of said one or more flexible conductors in said second set adapted to provide an electrical connection between said third and second chips.

21. The 3D chip stack as set forth in claim 20, further comprising an electrical couple between said first and third chips.

22. A 3D chip stack comprising:
a first chip having a first recess disposed along a lower surface of said first chip;
a second chip having a second recess disposed along an upper surface of said second chip, and a third recess disposed along a lower surface of said second chip;
a first stress relief apparatus having a first end coupled to said first recess and a second end coupled to said second recess, said first stress relief apparatus adapted to permit movement of the first and second chips relative to each other in response to an applied stress;
a first set of one or more flexible conductors disposed between said first chip and said second chip, each of said one or more flexible conductors in said first set adapted to provide an electrical connection between said first and second chips;
a third chip having a fourth recess disposed along an upper surface of said third chip;
a second stress relief apparatus having a first end coupled to said third recess and a second end coupled to said fourth recess, said second stress relief apparatus adapted to permit movement of the second and third chips relative to each other in response to an applied stress; and
a second set of one or more flexible conductors disposed between said second chip and said third chip, each of said one or more flexible conductors in said second set adapted to provide an electrical connection between said second and third chips.

23. The 3D chip stack as set forth in claim 22, wherein at least one of said one or more flexible conductors in at least one of said first or second sets comprises a carbon nanotube.

24. The 3D chip stack as set forth in claim 22, wherein at least one of said one or more flexible conductors in at least one of said first or second sets comprises a spring.

25. The 3D chip stack as set forth in claim 22, wherein said first chip further comprises a first through silicon via, and said first recess is disposed within said first through silicon via.

26. The 3D chip stack as set forth in claim 25, wherein said second chip further comprises a second through silicon via and a third through silicon via, and said second recess is disposed within said second through silicon via and said third recess is disposed within said third through silicon via.

27. The 3D chip stack as set forth in claim 26, wherein said third chip further comprises a fourth through silicon via, and said fourth recess is disposed within said fourth through silicon via.

28. The 3D chip stack as set forth in claim 22, wherein at least one end of at least one of said one or more flexible conductors is adapted to be disposed within a through silicon via.

29. The 3D chip stack as set forth in claim 22, wherein said first stress relief apparatus provides an electrical connection between said first and second chip, and said second stress relief apparatus provides an electrical connection between said second chip and said third chip.

30. The 3D chip stack as set forth in claim 22, wherein said first recess is shaped to conform to said first end of said first stress relief apparatus, and said second recess is shaped to conform to said second end of said first stress relief apparatus.

31. The 3D chip stack as set forth in claim 22, wherein said third recess is shaped to conform to said first end of said second stress relief apparatus, and said fourth recess is shaped to conform to said second end of said second stress relief apparatus.

32. The 3D chip stack as set forth in claim 22, wherein at least one of said first, second, third, or fourth recess provides an interference fit.

33. The 3D chip stack as set forth in claim 22, wherein at least one of said first, second, third, or fourth recess provides a loose fit.

34. The 3D chip stack as set forth in claim 22, wherein said first end of said first stress relief apparatus is a rod.

35. The 3D chip stack as set forth in claim 22, wherein said second end of said first stress relief apparatus is an ellipsoid.

36. The 3D chip stack as set forth in claim 22, wherein said first end of said second stress relief apparatus is a rod.

37. The 3D chip stack as set forth in claim 22, wherein said second end of said second stress relief apparatus is an ellipsoid.

38. The 3D chip stack as set forth in claim 22, wherein said second stress relief apparatus is different than said first stress relief apparatus.

39. The 3D chip stack as set forth in claim 22, wherein at least one of said first stress relief apparatus or said second stress relief apparatus further comprises an ellipsoid ball-and-socket joint connected between its respective first and second ends.

40. The 3D chip stack as set forth in claim 22, wherein at least one of said first stress relief apparatus or said second stress relief apparatus further comprises a hinge joint connected between its respective first and second ends.

41. The 3D chip stack as set forth in claim 22, wherein at least one of said first stress relief apparatus or said second stress relief apparatus further comprises a pivot joint connected between its respective said first and second ends.

42. The 3D chip stack as set forth in claim 22, wherein at least one of said first stress relief apparatus or said second stress relief apparatus further comprises a saddle joint connected between its respective first and second ends.

43. The 3D chip stack as set forth in claim 22, further comprising:
   an elastic thermal material disposed between said first, second and third chips, said elastic thermal material adapted to expand in response to thermal energy generated by at least one of said first, second, or third chips; and
   a thermally-conductive material disposed along the outside surfaces of said first chip, said second chip, said third chip, and said elastic thermal material, said thermally-conductive material adapted to receive thermal energy from said elastic thermal material, and dissipate said thermal energy from said chip stack.

44. The 3D chip stack as set forth in claim 22, wherein said first set of one or more flexible conductors is adapted to be disposed in an array between said first chip and said second chip.

45. The 3D chip stack as set forth in claim 22, wherein said second set of one or more flexible conductors is adapted to be disposed in an array between said second chip and said third chip.

46. The 3D chip stack as set forth in claim 22, further comprising:
   a fourth chip having a fifth recess disposed along a lower surface of said fourth chip;
   a third stress relief apparatus having a first end coupled to said fifth recess and a second end coupled to a sixth recess, said sixth recess disposed along an upper surface of said second chip, and said third stress relief apparatus adapted to permit movement of the fourth and second chips relative to each other in response to an applied stress; and
   a second set of one or more flexible conductors disposed between said fourth chip and said second chip, each of said one or more flexible conductors in said second set adapted to provide an electrical connection between said fourth and second chips.

47. The 3D chip stack as set forth in claim 46, further comprising an electrical couple between said first and fourth chips.

48. The 3D chip stack as set forth in claim 46, further comprising:
   an elastic thermal material disposed between said first, second, third, and fourth chips, said elastic thermal material adapted to expand in response to thermal energy generated by at least one of said first, second, third, or fourth chips; and
   a thermally-conductive material disposed along the outside surfaces of said first chip, said second chip, said third chip, said fourth chip, and said elastic thermal material, said thermally-conductive material adapted to receive thermal energy from said elastic thermal material, and dissipate said thermal energy from said chip stack.

49. A 3D chip stack comprising:
   a first stress relief apparatus having a first end coupled to a first chip and a second end coupled to a first surface of a second chip, said first stress relief apparatus adapted to permit movement of the first and second chips relative to each other in response to an applied stress;
   a first set of one or more flexible conductors disposed between said first chip and said second chip, each of said one or more flexible conductors in said first set adapted to provide an electrical connection between said first and second chips;
   a second stress relief apparatus having a first end coupled to a third chip and a second end coupled to said first surface of said second chip, said second stress relief apparatus adapted to permit movement of the third and second chips relative to each other in response to an applied stress;
   a second set of one or more flexible conductors disposed between said third chip and said second chip, each of said one or more flexible conductors in said second set adapted to provide an electrical connection between said third and second chips;
   an elastic thermal material disposed between said first, second, and third chips, said elastic thermal material adapted to expand in response to thermal energy generated by at least one of said first, second, or third chips; and
   a thermally-conductive material disposed along the outside surfaces of said first chip, said second chip, said third chip, and said elastic thermal material, said thermally-conductive material adapted to receive thermal energy from said elastic thermal material, and dissipate said thermal energy from said chip stack.

50. The 3D chip stack as set forth in claim 49, further comprising an electrical couple between said first and third chips.

* * * * *